US008739398B2

(12) United States Patent
Mayyas et al.

(10) Patent No.: US 8,739,398 B2
(45) Date of Patent: Jun. 3, 2014

(54) METHOD AND APPARATUS FOR DETETHERING MESOSCALE, MICROSCALE, AND NANOSCALE COMPONENTS AND DEVICES

(75) Inventors: Mohammad A. Mayyas, Arlington, TX (US); Panayoitis S. Shiakolas, Irving, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 962 days.

(21) Appl. No.: 12/744,049

(22) PCT Filed: Nov. 20, 2008

(86) PCT No.: PCT/US2008/084251
§ 371 (c)(1),
(2), (4) Date: Aug. 24, 2010

(87) PCT Pub. No.: WO2009/067635
PCT Pub. Date: May 28, 2009

(65) Prior Publication Data
US 2010/0306993 A1    Dec. 9, 2010

Related U.S. Application Data

(60) Provisional application No. 60/989,230, filed on Nov. 20, 2007.

(51) Int. Cl.
*H05K 3/30*     (2006.01)
*H05K 3/34*     (2006.01)
(52) U.S. Cl.
USPC ............................................. 29/832; 29/840
(58) Field of Classification Search
USPC ........... 29/832, 840; 228/44.7, 120, 138, 177, 228/191; 414/935, 936; 257/737
See application file for complete search history.

(56) References Cited

U.S. PATENT DOCUMENTS 6,142,358 A * 11/2000 Cohn et al. .................... 228/44.7
6,232,150 B1 * 5/2001 Lin et al. ........................ 438/119
(Continued)

FOREIGN PATENT DOCUMENTS

WO        2009067635        5/2009

OTHER PUBLICATIONS

Ishihara, K. et al. "An Inertial Sensor Technology using DRIE and Water Bonding with Interconnecting Capability," Journal of Microelectronmechanical Systems, vol. 8, No. 4, Dec. 1999 (6 pages).*

(Continued)

*Primary Examiner* — David Angwin
(74) *Attorney, Agent, or Firm* — Chowdhury & Georgakis, P.C.

(57) ABSTRACT

A method for forming an electronic device includes designing a tether having first and second ends; selecting an attachment point on the electronic device; attaching the first end of the tether to the attachment point, the electronic device being encapsulated in a cell; selecting an anchor point; attaching the second end of the tether to the anchor point; determining fracture condition at which the first end of the tether detaches from the attachment point; agitating the cell at the fracture conditions so as to detach the first end of the tether from the attachment point; and separating the electronic device from the cell. Also provided is a method for designing a plurality of electronic devices, wherein each of the electronic devices is encapsulated in a cell of a wafer, die or other holder and wherein the fracture conditions are the same for a group of the electronic devices.

20 Claims, 12 Drawing Sheets

(56) References Cited

U.S. PATENT DOCUMENTS

| | | | |
|---|---|---|---|
| 6,238,580 B1* | 5/2001 | Cole et al. | 216/2 |
| 6,268,635 B1* | 7/2001 | Wood | 257/415 |
| 6,297,072 B1* | 10/2001 | Tilmans et al. | 438/106 |
| 6,407,478 B1* | 6/2002 | Wood et al. | 310/307 |
| 6,608,714 B2* | 8/2003 | Hanson et al. | 359/296 |
| 6,624,003 B1* | 9/2003 | Rice | 438/106 |
| 6,655,964 B2* | 12/2003 | Fork et al. | 439/55 |
| 6,660,564 B2* | 12/2003 | Brady | 438/119 |
| 6,666,979 B2* | 12/2003 | Chinn et al. | 216/2 |
| 6,677,225 B1* | 1/2004 | Ellis et al. | 438/598 |
| 6,679,055 B1* | 1/2004 | Ellis | 60/527 |
| 6,691,513 B1* | 2/2004 | Kolesar | 60/527 |
| 6,708,491 B1* | 3/2004 | Weaver et al. | 60/527 |
| 6,772,509 B2* | 8/2004 | Chen et al. | 29/825 |
| 6,806,557 B2* | 10/2004 | Ding | 257/659 |
| 6,822,326 B2* | 11/2004 | Enquist et al. | 257/729 |
| 6,954,020 B2* | 10/2005 | Ma et al. | 310/309 |
| 6,969,635 B2* | 11/2005 | Patel et al. | 438/107 |
| 7,022,546 B2* | 4/2006 | Spooner et al. | 438/106 |
| 7,036,312 B2* | 5/2006 | Menard et al. | 60/527 |
| 7,250,353 B2* | 7/2007 | Nasiri et al. | 438/460 |
| 7,621,036 B2* | 11/2009 | Cros et al. | 29/595 |
| 2006/0105545 A1* | 5/2006 | Tseng et al. | 438/460 |
| 2007/0084042 A1* | 4/2007 | Challoner et al. | 29/592.1 |
| 2008/0301933 A1* | 12/2008 | Miller et al. | 29/830 |

OTHER PUBLICATIONS

Kaya, T. et al. "A Study of Nonlinear Deflection Dynamics of a Piezoelectric Accelerometer," Proceedings of Femlab Conference, 2005 (6 pages).*

Chiu, Y. et al. "Fuse-Tethers in MEMS: Theory and Operation", Canadian Conference on Electrical and Computer and Engineering, May 2005, pp. 1517-1520 (4 pages).

Chung, S. et al. "Microreplication techniques using soft lithography", Microelectronic Engineering, vol. 75, 2004, pp. 194-200 (7 pages).

Ganesh, V.P. et al. "Overview and Emerging Challenges in Mechanical Dicing of Silicon Wafers", 8th Electronic Packaging Technology Conference, 2006, pp. 15-21 (7 pages).

Weiss, P. "MEMS & MOEMS Reliability: Wafer-Level Packaging and Low-Temperature Processing Issues", IEEE/LEOS Workshop on Fibres and Optical Passive Components, 2005 (14 pages).

Kaajakari, V. et al. "Pulsed Ultrasonic Release and Assembly of Micromachines", 10th International Conference on Solid-State Sensors and Actuators, 1999, pp. 212-215 (4 pages).

Kim, J. et al. "Comparative Study of Various Release Methods for Polysilicon Surface Micromachining", 10th Annual International Workshop on Micro Electro Mechanical Systems, 1997, pp. 442-447 (6 pages).

Kumagai, M. et al. "Advanced Dicing Technology for Semiconductor Wafer-Stealth Dicing", IEEE Transactions on Semiconductor Manufacturing, vol. 20 No. 3, Aug. 2007, pp. 259-265 (7 pages).

Wang, Z. et al. "300-mm Low-k Wafer Dicing Saw Development", IEEE Transactions on Electronics Packaging Manufacturing, vol. 30, No. 4, Oct. 2007, pp. 313-319 (7 pages).

Metz, S. "Partial Release and Detachment of Microfabricated Metal and Polymer Structures by Anodic Metal Dissolution", Journal of Microelectromechanical Systems, vol. 14 No. 2, Apr. 2005, pp. 383-391 (9 pages).

Tsui, K. et al. "Micromachined end-effector and techniques for directed MEMS assembly", Journal of Micromechanics and Microengineering, vol. 14, No. 4, Apr. 2004, pp. 542-549 (8 pages).

Plaza, J. et al. "Definition of high aspect ratio glass column", Senors and Actuators A, vol. 105, Iss. 3, Aug. 2003, pp. 305-310 (6 pages).

Savkar, A. et al. "On the Use of Structural Vibrations to Release Stiction Failed MEMS", Journal of Microelectromechanical Systems, vol. 16, No. 1, Feb. 2007, pp. 163-173 (11 pages).

Shiuann, L. "Laser as a Future Direction for Wafer Dicing: Parametric Study and Quality Assessment", 31st International Conference on Electronics Manufacturing and Technology, Nov. 2007, pp. 506-509 (4 pages).

Suh, H. et al. "Dendritic Material as a Dry-Release Sacrificial Layer", Journal of Microelectomechanical Systems, vol. 9, No. 2, Jun. 2000, pp. 198-205 (8 pages).

PCT/US2008/084251 Search Report and Written Opinion, Feb. 4, 2009 (11 pages).

Ishihara, K. et al. "An Inertial Sensor Technology using DRIE and Water Bonding with Interconnecting Capability", Journal of Microelectromechanical Systems , vol. 8 No. 4, Dec. 1999 (6 pages).

Kaya, T. et al. "A Study of Nonlinear Deflection Dynamics of a Piezoelectric Accelerometer", Proceedings of Femlab Conference, 2005 (6 pages).

Judy, J.W. "Microelectromechanical Systems (MEMS): Fabrication, Design, and Applications", Journal of Smart Materials and Structures, 2001 (25 pages).

Monajemi, P. et al. "Thick Single Crystal Silicon MEMS with High Aspect Ratio Vertical Air-Gaps", SPIE Micromachining/Microfabrication Process, 2005 (10 pages).

* cited by examiner

METHOD AND APPARATUS FOR DETETHERING MESOSCALE, MICROSCALE, AND NANOSCALE COMPONENTS AND DEVICES

CROSS REFERENCE TO RELATED APPLICATION

This application claims priority under 35 USC §119(e)(1) of Provisional Application No. 60/989,230, filed Nov. 20, 2007, incorporated herein by reference.

TECHNICAL FIELD OF THE INVENTION

The present invention generally relates to releasing microelectronic devices in a cell of wafer, die, or other holder after fabrication. More particularly, the invention relates to detaching of components or devices attached to the frame of the cell by one or more tethers. Still more particularly, the invention relates to parallel and selective detethering of components or devices such as micro-electromechanical devices (MEMS) devices in the cells using vibratory agitation.

BACKGROUND OF THE INVENTION

Manufacture of microelectronic devices (each device may be composed of one or more components) such as integrated circuits, System on Chip (SOC), MEMS devices, polymeric devices includes fabrication of the devices/components on a wafer, die, or other holders (e.g. polymeric holder). Each device is located on a cell of the wafer, die, or other holder surrounded by the cell frame that is attached to the wafer, die, or other holder. Fabrication of the devices is usually performed using high throughput manufacturing so that multiple devices may be formed on the substrate of a wafer, die, or other holder without damage to the devices' microstructures formed on the substrate.

Design and fabrication of microelectronic devices includes anchor structures that connect the device to the cell and cell frame so that the device is not damaged or lost during the fabrication and transportation process. In order to be used, after the devices have been fabricated on the wafer, die, or other holder, each microelectronic device has to be released from the cell and cell frame. Some approaches to releasing the device connected to the cell and cell frame include mechanical probing, mechanical sawing, thermal diffusion, laser dicing, lithography and chemical releasing to break the attachments. However, such techniques result in low throughput release of devices since typically large numbers of devices cannot be released at the same time. Furthermore, these techniques require sensory vision feedback, may not result in complete separation of the devices from the cell and cell frame, and may introduce defects in the device caused by lubricants, heat, particles and stresses generated during the separation process. Different applications of integrated circuits, SOC, MEMS devices, polymeric devices or components may each require different approaches to releasing the device attached to the cell and cell frame. Thus, in any given fabrication process line, multiple pieces of equipment may be needed for different device types and application adding to the expense and complexity of the fabrication line.

SUMMARY OF THE INVENTION

In accordance with some embodiments of the invention, a method for forming an electronic device includes designing a tether, wherein the tether includes a first end and a second end; selecting an attachment point on the electronic device; attaching the first end of the tether to the attachment point, wherein the electronic device is encapsulated in a cell; selecting an anchor point; attaching the second end of the tether to the anchor point; determining fracture conditions that break the tether at the first end; agitating the cell at the fracture conditions to break the tether at the first end; and separating the electronic device from the cell.

In accordance with some other embodiments of the invention, a method comprises designing a plurality of electronic devices, wherein each of the electronic devices is encapsulated in a cell of a wafer, die or other holder; designing a plurality of tethers, wherein each tether includes a first end and a second end; selecting an attachment point on each of the plurality of electronic devices; attaching the first end of each of the plurality of tethers to one of the attachment points; selecting a plurality of anchor points; attaching the second end of each of the plurality of tethers to one of the anchor points; determining a fracture condition for each electronic device that breaks the tether at the first end, wherein the fracture condition is same for a group of electronic devices in the plurality of electronic devices; agitating the wafer, die or other holder at one of the fracture conditions to selectively and in parallel break the tether at the first end of one or more electronic devices; and separating the one or more electronic devices from the wafer, die or other holder.

In accordance with some embodiments of the invention, a holding device comprises a plurality of electronic devices, wherein each of the electronic devices is encapsulated in a cell; a plurality of tethers, wherein each tether includes a first end and a second end; an attachment point on each of the plurality of electronic devices, wherein the first end of each of the plurality of tethers connects to one of the attachment points; a plurality of anchor points in each cell, wherein the second end of each of the plurality of tethers connects to one of the anchor points; and wherein fracture conditions for each electronic device break the tether at the first end, wherein the fracture conditions are the same for a group of electronic devices in the plurality of electronic devices.

BRIEF DESCRIPTION OF THE DRAWINGS

FIG. 9(*a*), in accordance with some embodiments of the invention, shows an application of detethering in a vibratory agitation system;

FIG. 9(*b*), in accordance with some embodiments of the invention, shows a vibratory agitation system coupled to control circuitry;

DETAILED DESCRIPTION OF PREFERRED EMBODIMENTS

Figure 1:
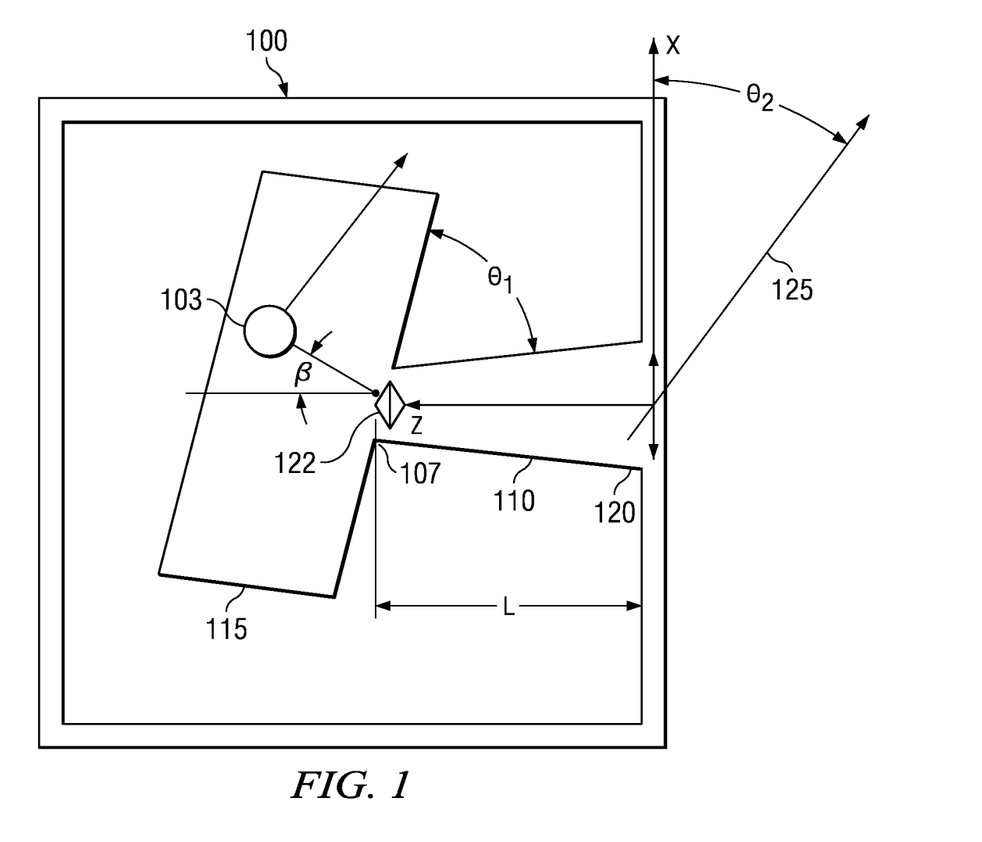
FIG. 1 shows device top view connected to the frame of a cell with a tether.

Referring to FIG. 1, a top view of a microelectronic device 115 connected to the frame 100 of a cell with a cantilever beam (hereinafter "tether") 110 is shown. The microelectronic device 115 may be an integrated circuit device, SOC device, MEMS device, polymeric device or any other type of device that can be fabricated. A device may be composed of one or more components. In accordance with some embodiments of the invention, the process technology used to fabricate the microelectronic device may be microtechnology, nanotechnology or smaller. In some other embodiments of the inventions, the process technology may be centimeter technology or larger. One end of the tether of length L includes a neck 107 that may be coupled to the device 115 at an angle $\theta_1$ in accordance with some embodiments of the invention. The angle $\theta_1$ focuses concentration of the stress caused by vibratory agitation at the neck 107 of the tether to detach the device from the tether. Notch 122, described in greater detail below, may also help focus concentration of the stress caused by vibratory agitation at the neck 107 of the tether to detach the device from the tether. Device 115 may be modeled with a center of gravity 103 and point mass m at the center of gravity. The angle of the center of gravity from the beam lateral axis z may be defined as $\beta$, the angle that the device travels upon fracture from the tether. Tether 110 may connect to cell frame 100 at anchor 120. Vertical axis x along the cell frame may be perpendicular to lateral axis z. Agitation vector 125 applied to excite anchor 120 may be at an angle $\theta_2$ from vertical axis x.

In accordance with some embodiments of the invention, tether 110 may be a linear breadth tapered cantilever beam, prismatic cantilever beam, tapered cantilever beam of truncated wedges, tapered cantilever beam of truncated cone, doubly-tapered cantilevered beam, or group of cantilever beams truncated at different shape-functions.

Figure 2:
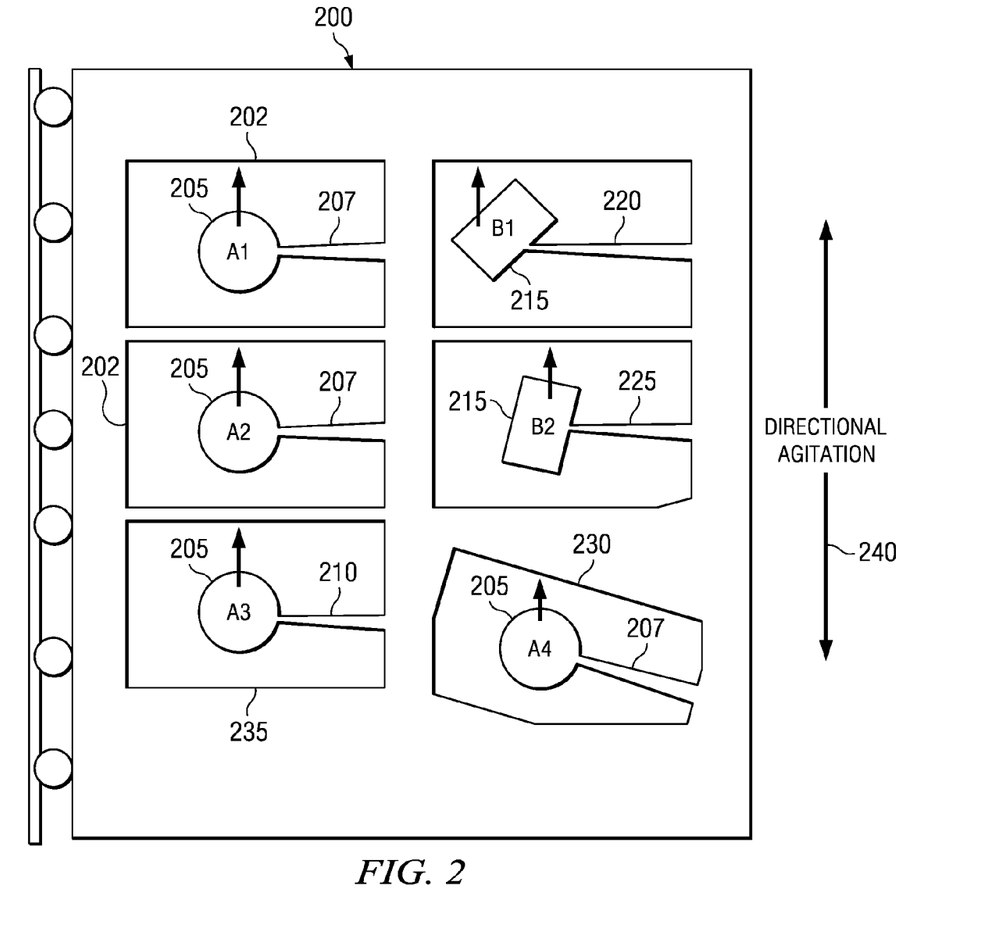
FIG. 2 is a schematic of different tethered devices fabricated in two columns of a wafer, die, or other holder.

Turning now to FIG. 2, a schematic of various different devices attached to cell frame by different tethers fabricated on a wafer, die, or other holder 200 is shown. Separation of a device from its tether is caused by applying external oscillatory displacement to the wafer, die, or other holder that encapsulates the cells. Each cell includes one or more devices attached to the cells frame by one or more tethers. Each wafer, die, or other holder may include a large number of cells as shown in FIG. 2—shaking the wafer, die, or other holder with directional agitation transmits forces to the tethered devices. Sufficient frequencies and amplitudes of the directional agitation produce inertial forces on the device that cause breaks on the tether attached to the device at a predefined location.

As shown in FIG. 2, devices A1 and A2 205 are identical devices with identical tethers 207 attaching the devices to cell frame 202. In accordance with some embodiments of the invention, upward/downward directional agitation 240 causes same anchor excitation to devices 205 and tethers 207 causing simultaneous fracture at the neck of each tether. In accordance with some other embodiments, directional agitation 240 may be at a different angle. Thus, monolithic parallel releasing of identical devices with identical tethers may be accomplished by application of fracture conditions to simultaneously generate fracture stress in the tether.

FIG. 2 may also be used to illustrate selective detethering of different devices attached by different tethers to cell frame. Modification of the design of the device and tether causes the dynamic response of the device and tether in each cell to vary under same directional agitation 240. Thus, devices A1, A2, and A3 205 are the same but because tether 210 is different from tethers 207, devices A1 and A2 fracture from tethers 207 at a one directional agitation frequency $f_1$. However, device A3 fractures from tether 210 at another directional agitation frequency $f_2$. Similarly, device B1 and B2 are identical but attached to their respective cell frames by different tethers 220 and 225. Tethers 220 and 225 are attached to device B1 and B2 at different angles $\theta$ at the neck of the tether. The different tether designs and tether angle of attachment $\theta$ to the device result in different agitation frequency $f_3$ and $f_4$ for devices B1 and B2 215 fracturing from tethers 220 and 225.

A different agitation frequency $f_5$ for directional agitation vector 240 may be needed for device fracturing from tether even if device and tether are same but orientation of cell frame is different as shown in cell 230. Thus, devices A1, A2, and A4 205 are the same and tethers 207 are the same but because the orientation of cell frame 230 is different from cell frame 202 on wafer, die, or other holder 200, directional agitation 240 frequency $f_5$ different from $f_1$ causes device A4 in cell 230 to fracture from tether 207. Alternatively, rotation of the wafer, die, or other holder 200 with respect to tether anchors allows transmitting in-plane agitation causing device A4 to fracture from tether 207. Thus, applying directional agitation frequency $f_1$ to tether 207 in cell 202 that is ninety degrees to directional agitation vector 240, device A1 and A2 will fracture from tether 207 but device A4 in cell 230 will not fracture from tether 207. Rotating the wafer, die, or other holder counterclockwise so tether 207 in cell 230 is at ninety degree angle to directional agitation vector 240 and agitating at frequency $f_1$ will, for example, cause device A4 in cell 230 to fracture from tether 207.

Figure 3:
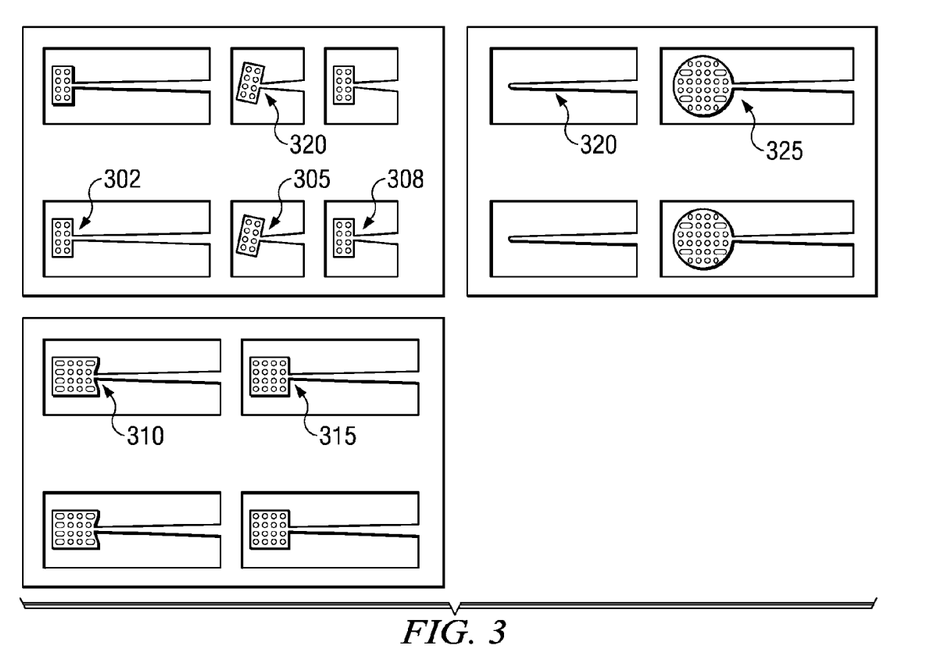
FIG. 3 is a schematic of MEMS devices tethered at different angles and notches fabricated on a wafer.

Referring to FIG. 3, a schematic of MEMS devices tethered at different angles and notches fabricated on a wafer are shown. The tethers shown in FIG. 3 are of different lengths and maximum width at tether anchor, minimum width at tether neck connection to device. The shape 310 of the device at the tether neck connection and angle $\theta_1$ 320 of the device to the tether defines the notch (see FIG. 1 122) that creates maximum stress concentration at the point of attachment of tether to the device.

Different tether lengths, angle $\theta_1$ and notch shape are shown in FIG. 3: 1) long tether 302 with $\theta_1$ at 90 degree angle; 2) short tether 305 with $\theta_1$ at 45 degree angle; 3) short tether 308 with $\theta_1$ at 90 degree angle; 4) long tether with concave notch 310 that results in angle $\theta_1$ at 45 degrees; 5) long tether without a notch 315 results in angle $\theta_1$ at 90 degrees; 6) long tether 320 without device attached at neck of tether after detethering; and 7) long tether with convex notch 325 that may accommodate any shape device at any of different angles $\theta_1$. The notch shown in 310 and 325 allows the device to easily break from tether during directional agitation but is strong enough to hold device during fabrication and handling processes.

Figure 4:
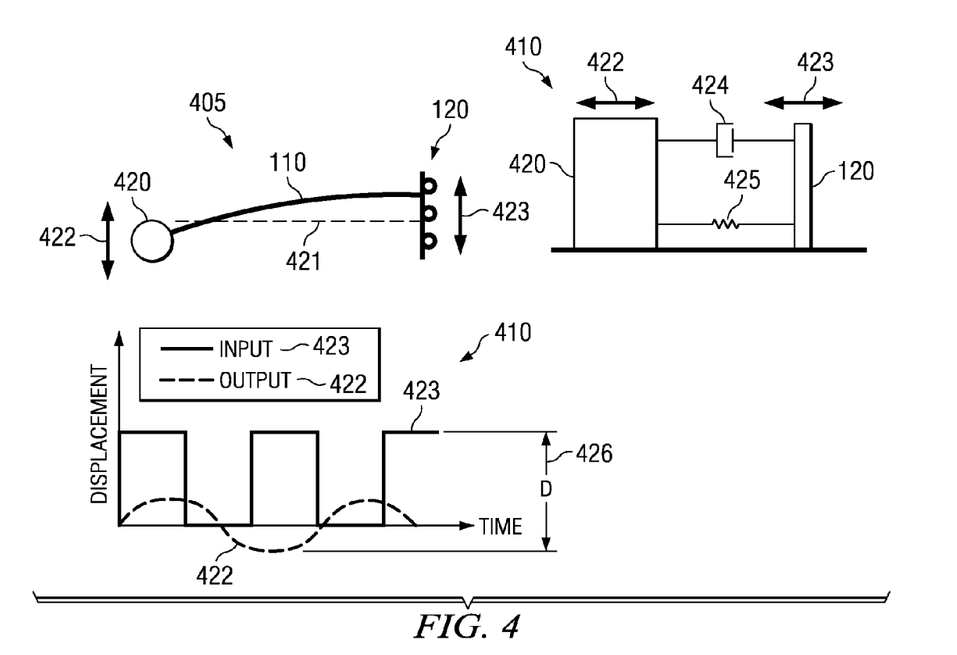
FIG. 4 shows mechanical modeling and time response of tethered devices in FIGS. 2 and 3.

Turning now to FIG. 4, mechanical modeling and time response of tethered devices of FIGS. 1-3 is shown. The parameters shown in FIGS. 1-3 are some of the parameters that may be investigated in the design and characterization of a tethered device. Variation of these and other design parameters discussed in more detail below provides a wide range of desired operating conditions for frequencies and amplitudes to detether devices and also leads to different tether shapes. This disclosure is meant to encompass all such different tether shapes based on the microfracture analysis of these and other design parameters.

In FIG. 4, cell 405 is depicted as anchor 120 moving with up and down directional agitation 423 that may be maximum relative displacement D 426 as shown in time response plot 415. Device mass 420 is attached to anchor 120 through tether 110 and moves relative to displacement reference 421. The motion of device mass 420 may be a sinusoidal motion 422 along displacement reference 421 as shown in time response plot 415. Equivalent model 410 of cell 405 shows device mass 420 coupled to anchor 120 through equivalent viscous damping 424 and equivalent elastic spring 425 that together model the behavior of tether 110. Device mass 420 has displacement 422 that may be a sinusoidal motion 422. Anchor 120 in equivalent model 410 has displacement 423 by up and down directional agitation as shown in time response plot 415.

Figure 5:
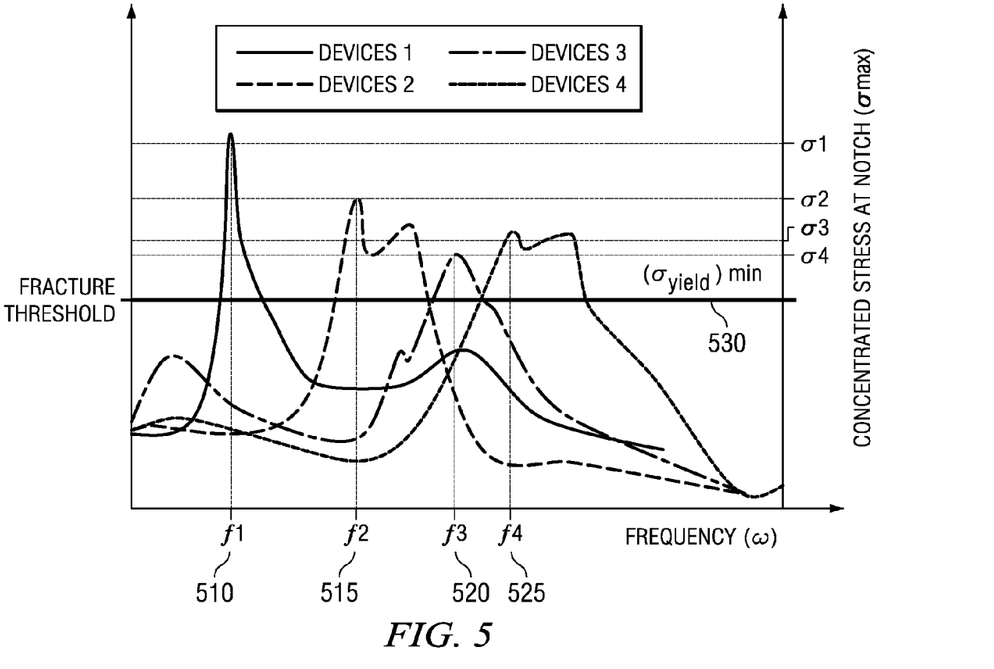
FIG. 5 is a graph of frequency versus stress showing detether frequencies of four devices.

Turning now to FIG. 5, a semi-log graph of frequency versus stress for detether frequencies of four groups of devices Devices 1-Devices 4 is shown. In accordance with some embodiments of the invention, FIG. 5 may allow determination of the critical frequencies $f_1$-$f_4$ upon which successful parallel and selective detethering of one group of devices from the four groups takes place. The devices in the four groups of devices may be fabricated on the same wafer, die, or other holder as shown in FIGS. 2-3. As shown in FIG. 5, each group of devices has unique detethering conditions that do not overlap with other group of devices. Design of the device attachment and tether for Devices1-Devices4 includes a fracture threshold 530 $(\sigma_{yield})_{min}$ stress above which the device breaks from the tether. The design of each group of devices attachment and tether occurs so that the frequencies of tether fracture at notch for each group of devices do not overlap, allowing parallel and selective detethering of one group of devices. Thus, for example, devices in group Devices1 fracture at frequency $f_1$ 510 with concentrated stress $\sigma_1$; devices in group Devices2 fracture at frequency $f_2$ 515 with concentrated stress $\sigma_2$; devices in group Devices3 fracture at frequency $f_3$ 520 with concentrated stress $\sigma_3$; and devices in group Devices4 fracture at frequency $f_4$ 525 with concentrated stress $\sigma_4$.

Figure 6A:
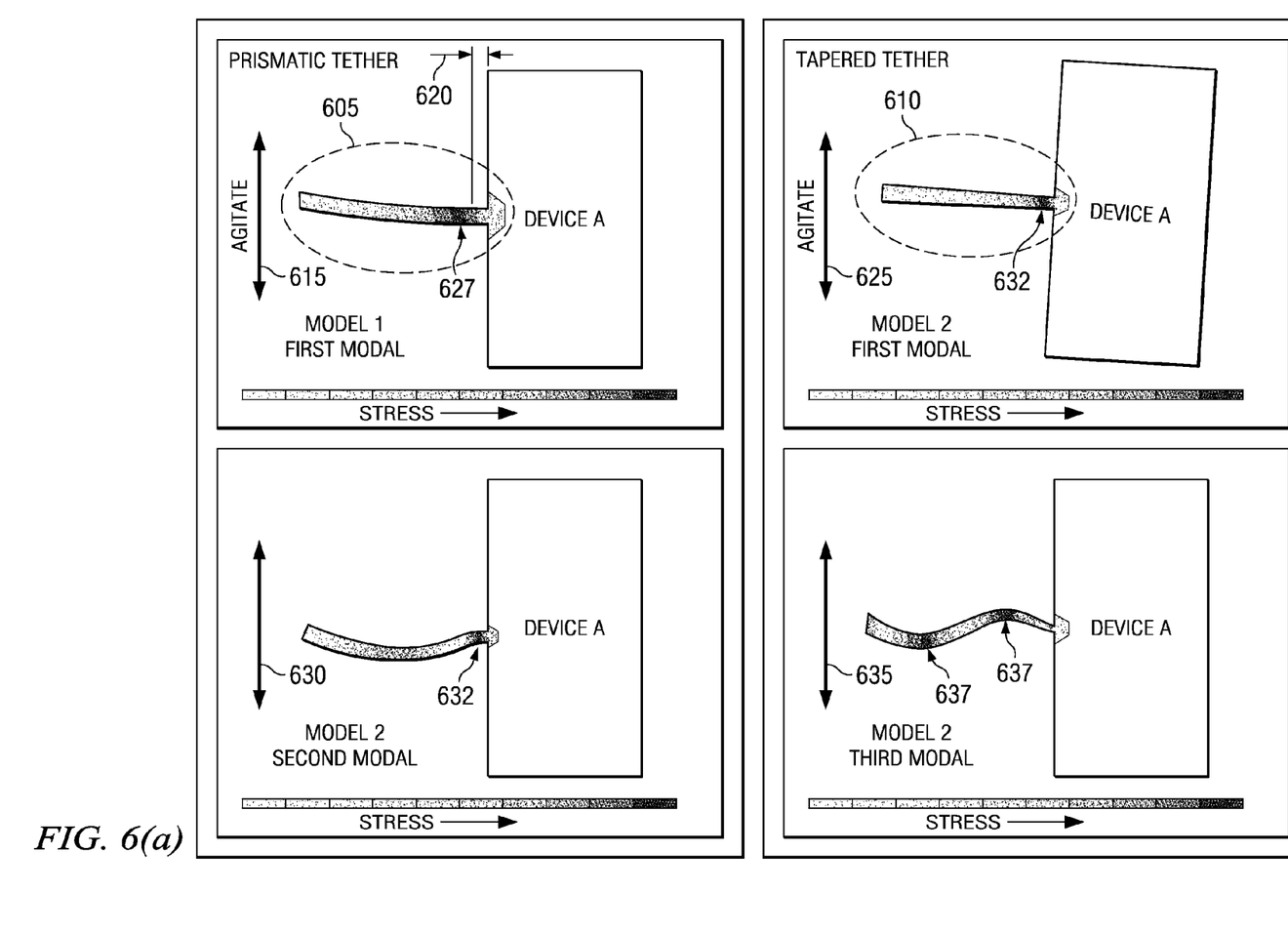
FIG. 6(a) shows tether fracture points of a device with two different tethers at different modal frequencies.

Finite element modeling, lumped modeling, and other analytical approaches allow determination of mechanical signatures including directional agitation frequency and amplitude to break the device from the tether at the neck. FIG. 6(a) shows tether fracture points of the same device with two different tethers (attached one at a time and not at the same time) at different modal frequencies using finite element modeling. Each type of tether oscillates at a fundamental frequency (first modal) and harmonic frequencies (second modal, third modal, fourth modal, and so on). A look-up table may be generated for each design of tether and device attachment to the tether indicating the modal frequencies at which stress is optimally applied to the neck of the tether allowing the device to cleanly break from the tether.

In FIG. 6(a), stresses on tether attached to device is shown for several modal frequencies. Model 1 prismatic tether 605 with directional agitation 615 at first modal frequency causes principal stress concentration to take place at a distance 620 from the neck edge. Thus, the device after breaking from the model 1 tether 605 could still have some portion of the tether attached to it. Model 2 tapered tether 610 with directional agitation 625 at first modal frequency causes principal stress concentration to take place at fracture point 627 at neck of tether close to device body. Thus, first modal frequency agitation of model 2 tether results in a fracture free from left over tether attached to the device. As can be seen in FIG. 6(a), second modal frequency agitation 630 of model 2 tapered tether results in a fracture point 632 slightly farther from the neck of the tether as compared to fracture point 627 caused by first modal frequency agitation. Third modal frequency agitation 635 of model 2 tapered tether results in multiple fracture points 637 at various distances from the neck of the tether. Based on the finite element modeling of the model 2 tapered tether, agitating the tether at first modal frequency results in the cleanest fracture at neck of tether close to device body. As mentioned above, performing modal frequency fracture analysis for each design of tether and device attachment to the tether allows creation of a look-up table that includes the optimal modal frequency of agitation for a device to cleanly break from its tether.

Figure 6B:
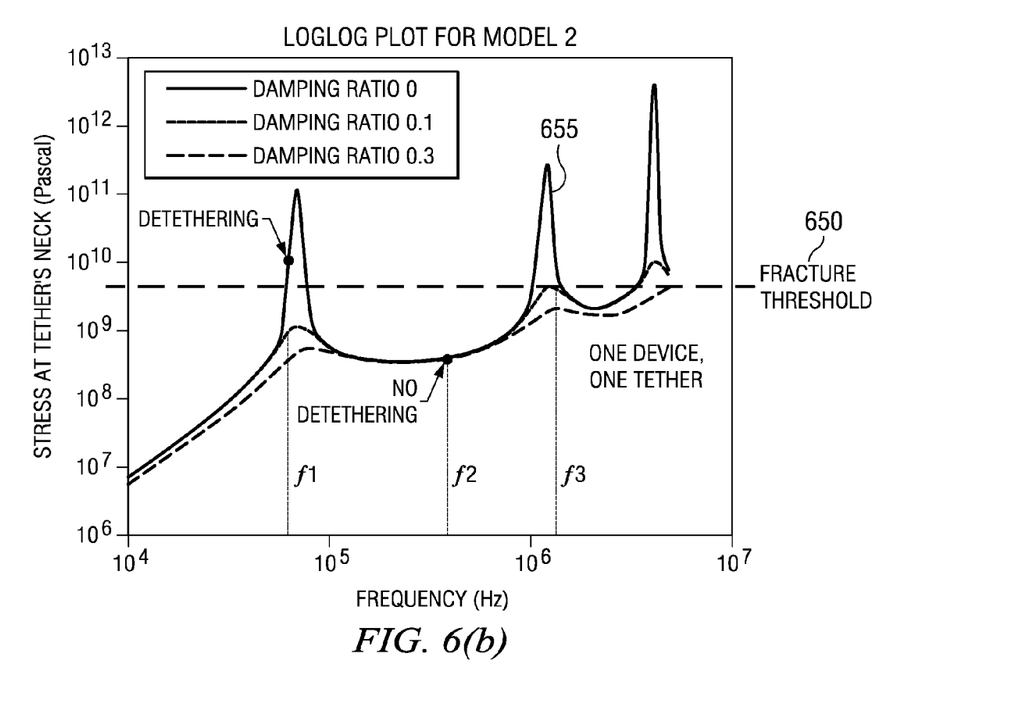
FIG. 6(b) is a graph of stress at neck of tether versus frequency at different damping.

Referring now to FIG. 6(b), a graph of stress at neck of tether versus frequency at different damping ratios for model 2 tapered tether and device A from FIG. 6(a) is shown. Material damping and air damping of the agitation reduces the amplitude of maximum stress at the neck of the tether while still allowing the device to break from the tether. Lower amplitude agitation because of damping may result in a cleaner break at the tether neck while reducing potential damage to the device for packaged devices that are vacuum sealed and unpackaged devices. FIG. 6(b) shows model 2 tether and device A stress at neck of device for agitation over a range of frequencies with various damping ratios. With zero damping ratio, a sharp, high intensity maximum amplitude peak at $f_1$ exceeds the stress fracture threshold 650 and results in the detethering of the device. Applying damping ratio of 0.1 results in smaller intensity amplitude peak at $f_3$ 655 that exceeds stress fracture threshold 650 and results in detethering of the device. In accordance with some embodiments of the invention, because the effect of damping reduces the amplitude of maximum stress at the neck of the tether, external introduction of damping effect may be advantageous. Thus, for example, in detethering of MEMS devices on a wafer, die, or other holder, use of vacuum to create damping effect may result in smaller intensity amplitude peak at modal frequency.

Figure 7A:
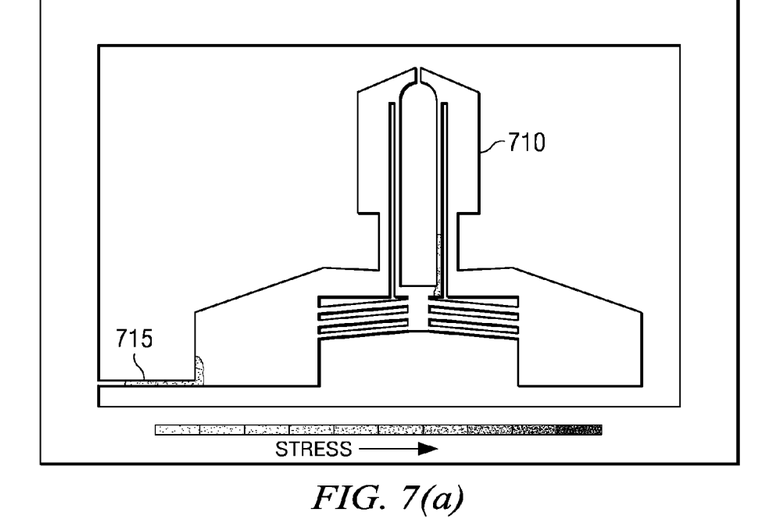
FIG. 7(a) shows a microgripper device in a unit cell.
Figure 7B:
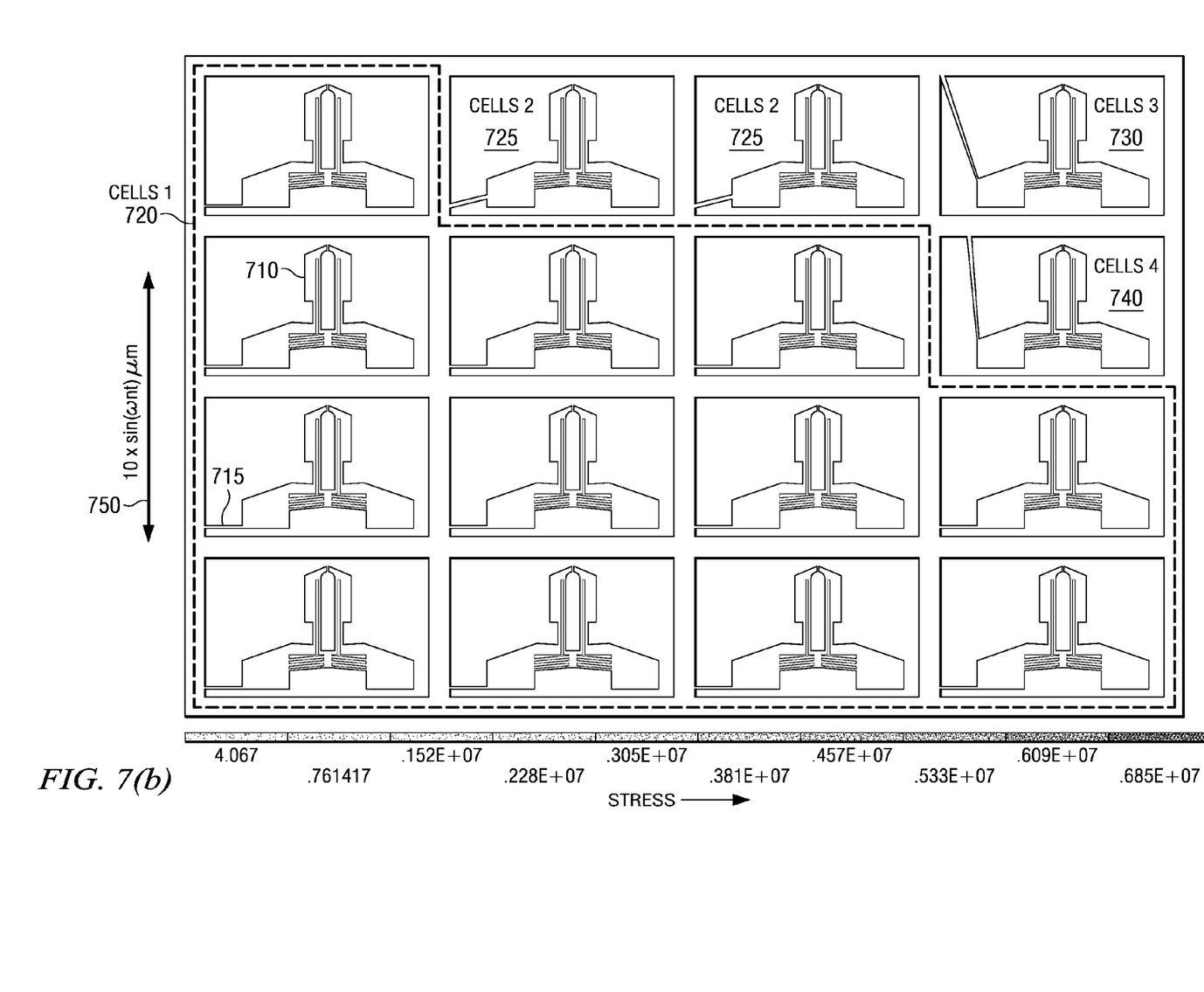
FIG. 7(b) shows four groups of microgripper cells in an array with each group having same tether and anchor location.
Figure 7C:
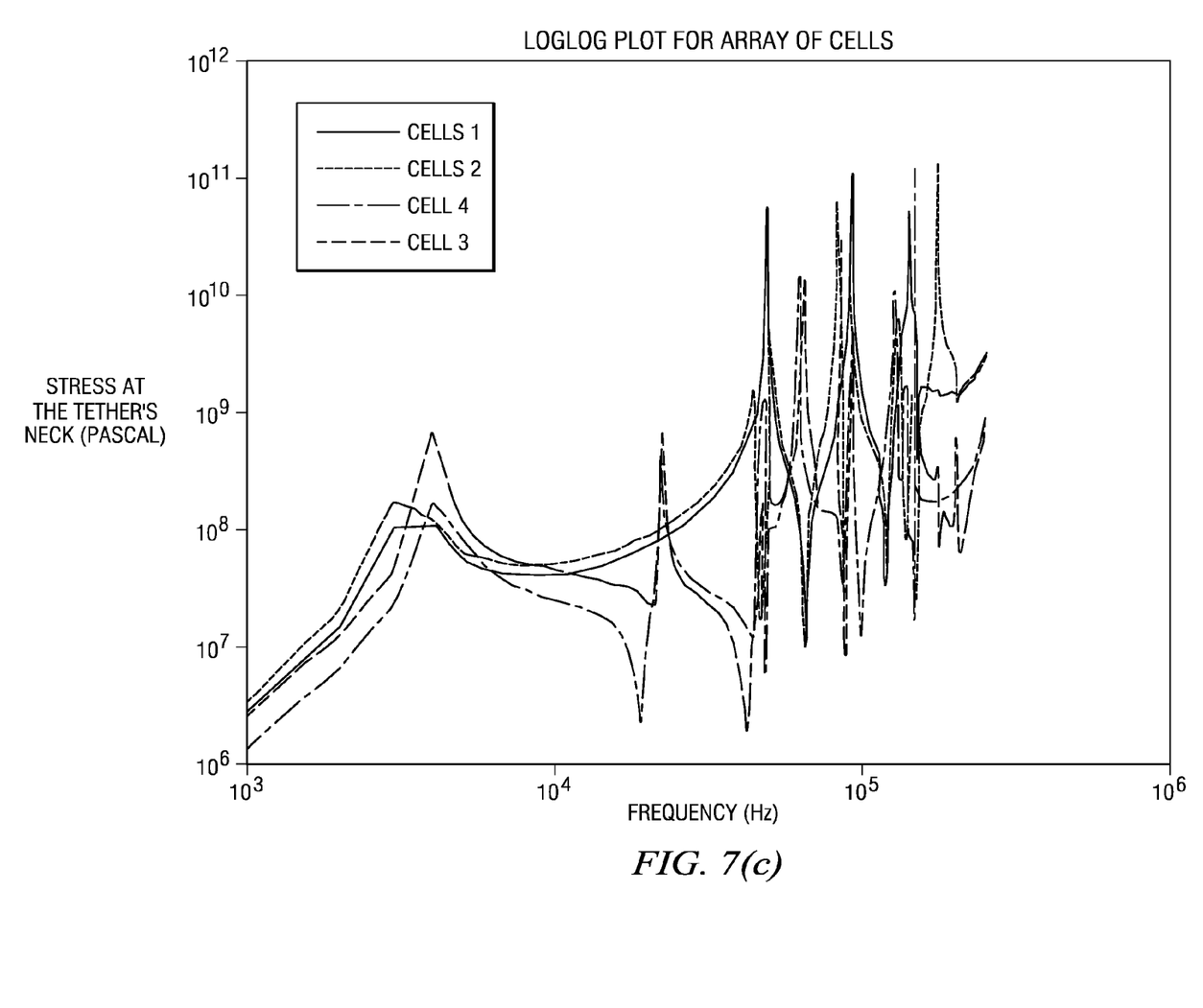
FIG. 7(c) is a graph of stress at neck of tether versus frequency for the four groups of cells shown in FIG. 7(b)

Finite element modeling of a complex MEMS device as shown in FIGS. 7(a)-7(c) such as a microgripper 710 in cell may also be performed. Cells 1 group 720, cells 2 group 725, cells 3 group 730 and cells 4 group 740 as shown in FIG. 7(b) may be detethered in parallel but selective manner using unique tethers needing distinct signatures for fracture that may be obtained by modal analysis for array of complex devices. In FIG. 7(b) each microgripper is identical, however the tether and anchor location is different for each cell group. Each cell in cells 1 group includes a microgripper 710 attached by model 2 tether shown in FIG. 6(a) at 90 degree perpendicular angle to left side cell frame anchor. Cells 2 group 725 includes a microgripper 710 attached by a different tether at a non-perpendicular angle with respect to left side cell frame anchor. Cells 3 group 730 and cells 4 group 740 each include a microgripper 710 attached by a tether longer then the tethers used in cells 1 group and cells 2 group. Both cells 3 group and cells 4 group tethers are identical and attached at non-perpendicular angles to top side cell frame anchor. Direction, frequency and amplitude of input agitation 750 is shown in FIG. 7(b) as amplitude of 10 and frequency f corresponding to $\omega=2\pi f$.

In accordance with some embodiments of the invention, each device or component in a cell may be attached by a single tether or multiple tethers of the same or different geometry to different anchoring locations in the cell. Each tether may form different angles $\theta_1$ (defined in FIG. 1) with the device or component in the cell.

FIG. 7(c) is a graph of stress at neck of tether versus frequency f for cells 1 group, cells 2 group, cells 3 group and cells 4 group shown in FIG. 7(b). The direction of agitation 750 is perpendicular to cells 1 group tethers horizontal direction. The tether in cells 2 group is at an angle with respect to the direction of agitation 750. The graph of stress versus frequency in FIG. 7(c) for cells 1 group and cells 2 group shows a similar modal response pattern for the two groups with a slight shift in frequency for the peaks of the two modal response patterns. As can be seen in FIG. 7(c), cells 3 group and cells 4 group with longer tethers than the other two groups and anchored at different angles to the top side of the cell frame have different modal response pattern with stress peaks at frequencies different from cells 1 group and cells 2 group. Thus, as mentioned above, directional input agitation conditions of varying amplitudes and frequencies for selective detethering can be determined for identical complex MEMS devices connected to cell frames with different tethers. The determined directional input agitation conditions may be applied to the identical complex MEMS devices to detether the devices without causing damage or failure to the complex devices.

Figure 8:
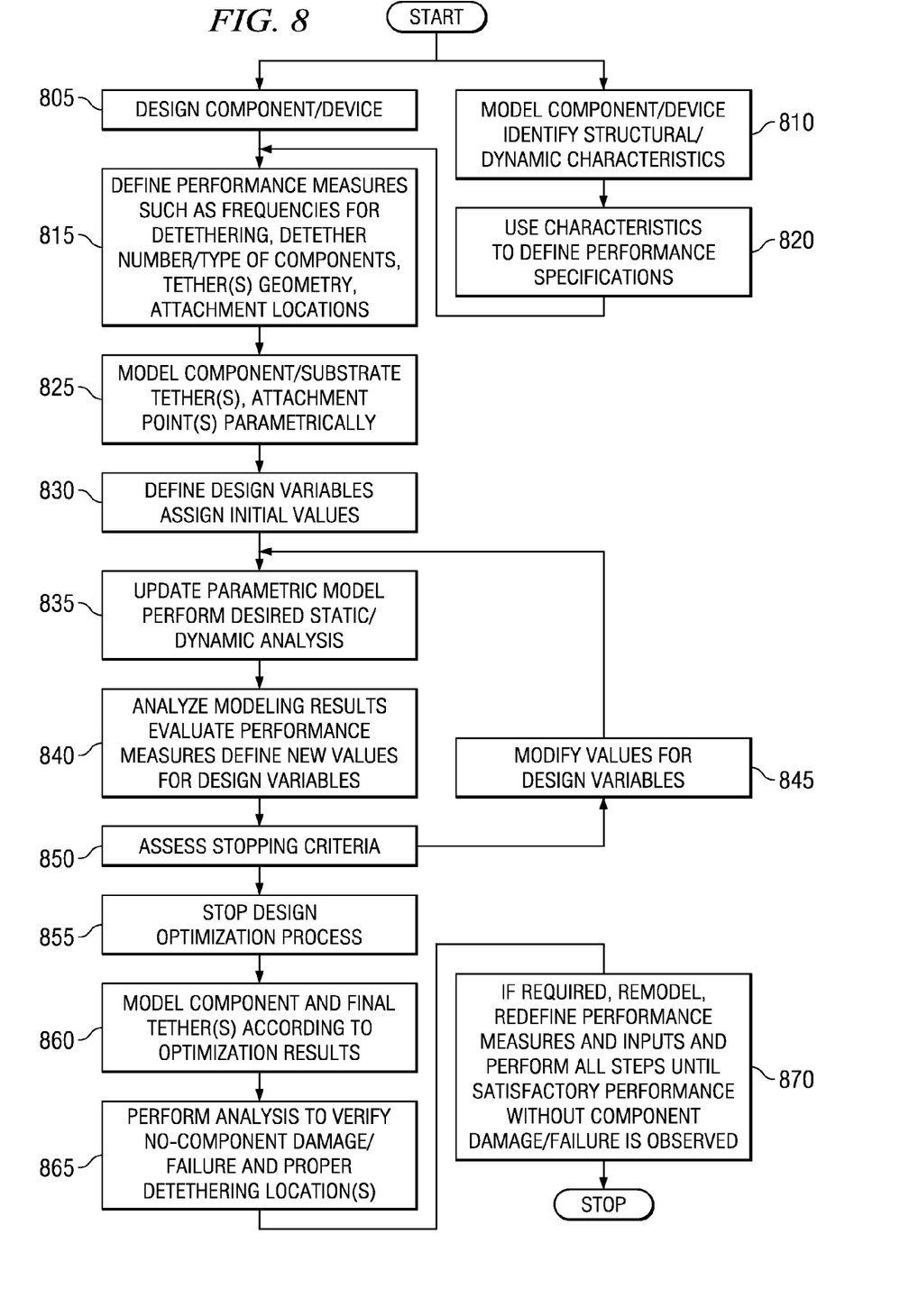
FIG. 8 shows a flowchart for design and anchor of tethers to cell frames in accordance with some embodiments of the invention.

Turning now to FIG. 8, a flowchart for design and anchor of tethers to cell frames in accordance with some embodiments of the invention is shown. In accordance with some embodiments, each cell in the wafer, die, or other holder may include a microelectronic device. Furthermore, some embodiments of the device may be attached to the cell frame by one or more tethers. In some other embodiments, each device may include a number of components with each component attached by a tether to the cell frame. As discussed above, the location of the tethers attachment to the component and the cell frame may be determined by finite element modeling analysis so that detethering of the component(s) takes place at directional agitation input of certain frequency and amplitude (FIG. 7(b)). In accordance with some other embodiments of the invention, the location of the tethers attachment to the component and the cell frame so that detethering of the component(s) takes place at directional agitation input of certain frequency and amplitude may also be determined by look-up tables created by experimental feasibility studies as discussed above.

In FIG. 8, a microelectronic device/component is designed for a particular application in block 805. In corresponding block 810, during design of the microelectronic device/component, the device/component enclosed in the cell is also modeled in finite element modeling software such as ANSYS™ or an equivalent functionality software product. Finite element modeling of the device/component identifies structural and dynamic characteristics such as the shape of the device, presence of notch (FIG. 3 310) at prospective tether connection location, susceptibility of the device to shaking and agitation and so on. In block 820, the structural and dynamic characteristics of the device/component is used to define general performance specifications such as frequency/amplitude upper and lower bounds, optimal tether attachment location and other features for use in tether design and attachment. Performance measures such as detethering at certain frequencies, number of components in a device, type of device/components, tether(s) geometry, attachment locations to cell frame and device/component, detethering of multiple similar/different components at a specified frequency are defined in block 815. In block 825, the tether is parametrically modeled in finite element software and attached on cell frame and device/component. Design optimization process is performed in block 830-block 855 to identify optimal design variables values that meet performance measures. Design variables are defined in block 830 and assigned initial values. As discussed in detail above, design variables may be tether geometric parameters, attachment locations on cell frame and device/component. Parametric model of tether and attachment on cell frame and device/component are updated based on design variables initial values in block 835. Static/dynamic modal analysis to determine directional agitation frequency and amplitude for breaking the tether also occurs in block 835. In block 840, the results of the modal analysis are assessed to evaluate whether performance measures have been satisfied. The results of the modal analysis may also define new values for the design variables in block 840. In block 850, a determination of whether performance measures have been satisfied occurs. If performance measures have not been satisfied, control moves to block 845 in which the design variable values are modified using various approaches to identify the new values for the design variables. The parametric model of tether and attachment on cell frame and device/component are updated with the new values of the design variables. Static/dynamic modal analysis is then performed in block 835 and the results of the analysis are assessed in block 840. This loop is repeated until performance measures are satisfied or until a number of iterations is reached. The design optimization process is stopped if a number of iterations is reached to prevent infinite loops as there may be a possibility that the desired performance measures cannot be met with the selected range of design variables values, attachment point(s) or desired frequency/amplitude of detethering. If a number of iterations has been reached, then control is passed to block 825 (not shown in FIG. 8) and a model of tether with different parameters (e.g. different number of tethers) is create, new design variable values are defined and the loop 835-850 is repeated. The design optimization process is stopped in block 855 if performance measures are satisfied or if the maximum number of iterations has been reached. The results of the design optimization process are incorporated into the device/component and final tether model in finite element modeling software in block 860. In block 865, the final design of one or more tethers and attachment(s) to cell frame and device/components is evaluated to determine if breaking of the tether(s) occurs in the proper place at neck of tether. An analysis in block 865 is performed of the final design to verify that the input directional agitation does not cause damage or failure to the device/component(s) but rather only causes detethering of the device/components. In block 870, if device/component(s) failure is detected, then the tether geometry, attachment location, number of tethers, and input frequencies/amplitudes are redefined, and the design variables are redefined. A new optimization analysis is performed until satisfactory detethering without device/component(s) damage or failure is observed.

Figure 9A:
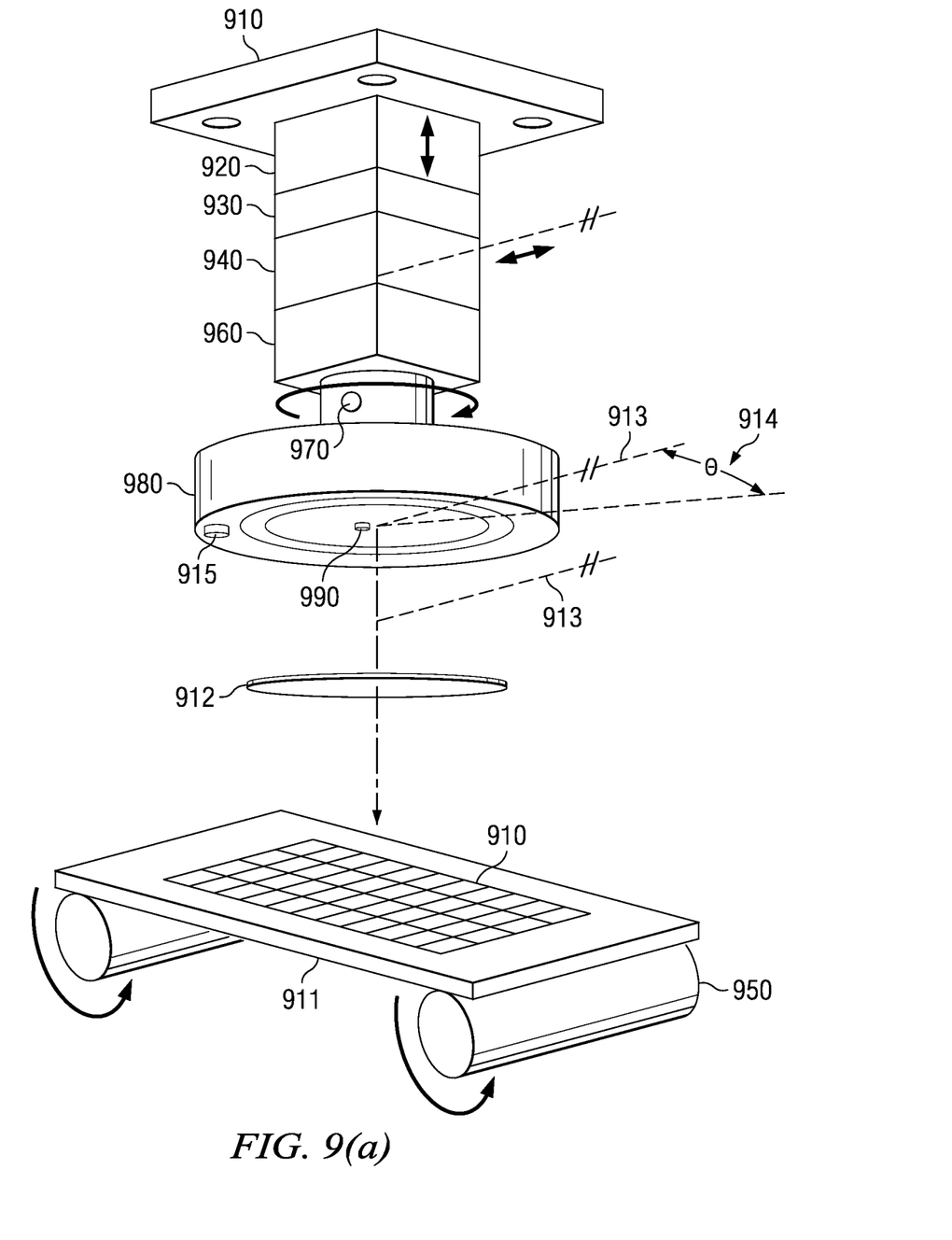

FIG. 9(a), in accordance with some embodiments of the invention, shows an application of detethering in a vibratory agitation system for microelectronics fabrication line. The apparatus of FIG. 9(a) allows parallel and selective detethering of microelectronic devices on wafer 912. The apparatus includes actuator blocks to provide controlled vibratory directional agitations at various frequencies and amplitudes. In some embodiments of the invention, the actuators may be piezoactuators, electromagnetic actuators, sonic actuators, or any type of actuator that can generate a controlled frequency. In the embodiment shown in FIG. 9(a), cubes of stacked piezoactuators 920, 940 are sandwiched between a rigid frame 910 and a rotary disc 980. Piezoactuator 920 can generate directional agitation out of plane and piezoactuator 940 can generate directional agitation in plane. Intermediate adapter 930 is placed between piezoactuators 920 and 940. Intermediate adapter 960 is present between piezoactuator 940 and locking mechanism 970. Locking mechanism 970 attaches to rotary disc 980. Rotary disc 980 holds wafer 912 along axis of alignment 913 and changes the angle θ 914 relative to axis of alignment 913 of in-plane directional agitation with respect to tethered devices. The rotary disc 980 includes a mechanical clamper or suction 990 mounted on the rotary disc and is used to hold the wafer 912. Rotary disc 980 also includes mechanical stopper/barrier 915 that may be used to "hammer" against the wafer to encourage additional conditions for simultaneous release of microelectronic devices. The released devices are caught by template 910 that sorts the devices as the non-sticking conveyor belt 911 moves on wheels 950.

Figure 9B:
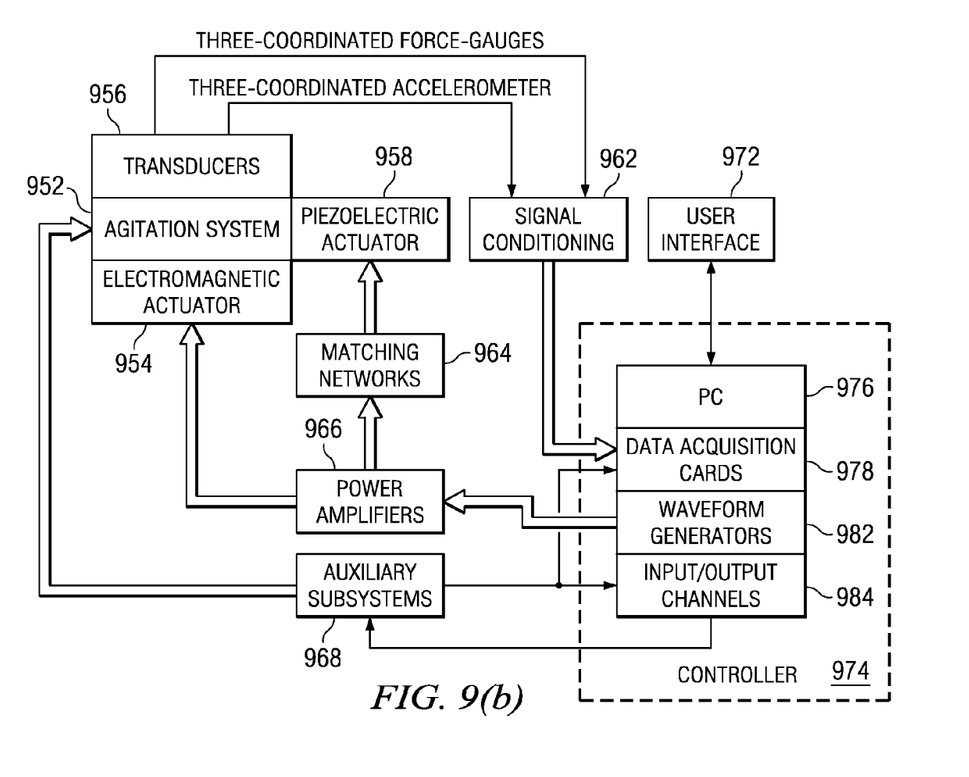

Turning now to FIG. 9(*b*), in accordance with some embodiments of the invention, shows a vibratory agitation system 952 coupled to control circuitry. In accordance with some embodiments of the invention, the agitation system 952 may be the apparatus shown in FIG. 9(*a*) and described above. Agitation system 952 may include transducers 956, one or more electromagnetic actuators 954 and one or more piezoelectric actuators 958. The actuators are able to generate vibratory directional agitation over a wide range of frequencies and amplitudes that may be needed to detether different microelectronic devices attached to cell frames. Transducers 956 outputs 3-coordinated force-gauge values and three-coordinated accelerometer values that are conditioned in signal conditioning circuit 962 and output to data acquisition cards 978. A user at user interface 972 coupled to controller 974 including personal computer (PC) 976 after performing the technique shown in flowchart of FIG. 8 may select proper parameters for controlled directional agitation. The parameters for controlled directional agitation are converted to signals that are generated by waveform generators 982 and output channels 984. The signals from waveforms generator 982 after power amplification 966 and matching 964 are sent to agitation system 952 and read back from accelerometer and force gauges in transducers 956. The signals from output channels 984 after auxiliary subsystems 968 are sent to agitation system 952 and read back from accelerometer and force gauges in transducers 956. As mentioned above, 3-coordinated force-gauge values and three-coordinated accelerometer values are conditioned in signal conditioning circuit 962 and out to data acquisition cards 978 to close the system and monitor the directional agitation in three dimensions. Auxiliary subsystems 968 may include (not shown in FIG. 9(*b*)) a pneumatic subsystem to hold wafers through vacuum chuck, cool down shakers, and other devices to perform related tasks. Auxiliary subsystems 968 may also include gas control system to control the gas around the wafer and thermal system to regulate wafer temperature at desired values.

Figure 10:
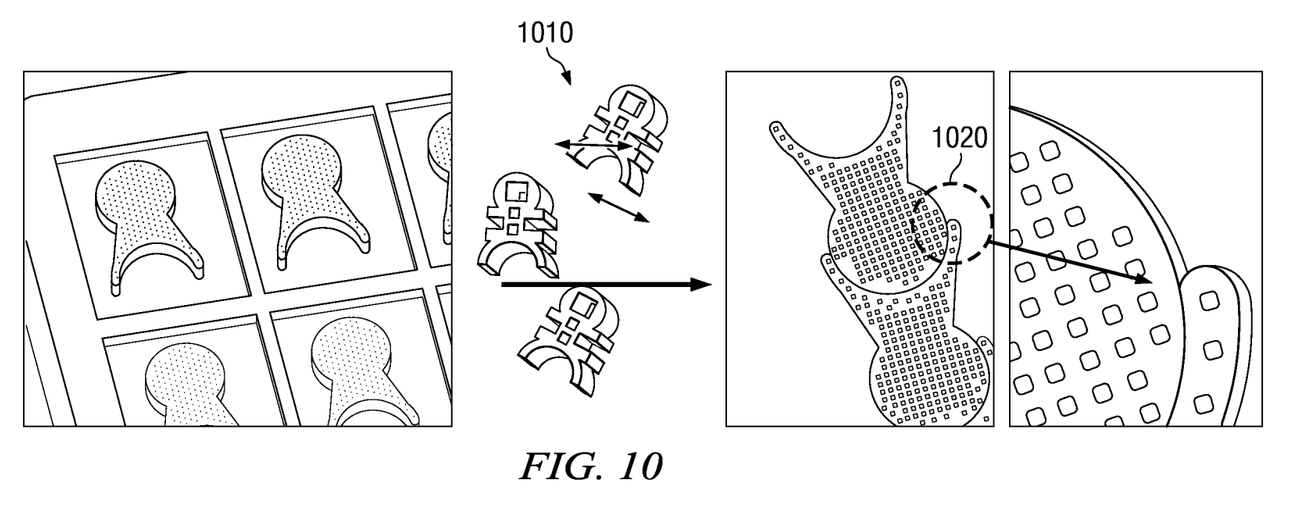
FIG. 10 shows use of agitation system of FIG. 9(*a*) for detethering to release large quantities of MEMS devices for self assembly.

FIG. 10 shows use of agitation system of FIG. 9(*a*) for detethering to release large quantities of MEMS devices 1010 for DNA based self assembly 1020. In accordance with some embodiments of the invention, the MEMS devices may be fabricated from Silicon on Insulator (SOI) by Deep Reactive Ion Etching (DRIE) process. In some other embodiments of the invention, the MEMS devices may be fabricated by laser bulk micromachining, lithography, PolyMUMPS, microinjection, hot embossing, and so on. Based on assembly principles, the MEMS devices stochastically organize themselves to form certain robotics systems.

Figure 11:
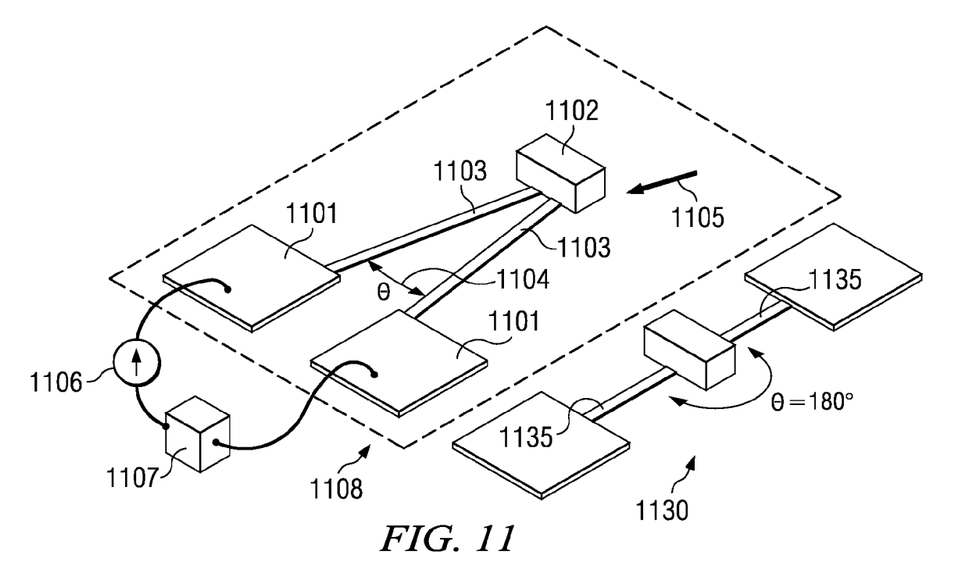
FIG. 11 shows, in accordance with some embodiments of the invention, an application of detethering in a safety inertial sensor.

Referring now to FIG. 11, in accordance with some embodiments of the invention, an application of detethering in a safety inertial sensor is shown. In accordance with some embodiments, cell 1108 containing safety inertial sensor includes double tethers 1103 separated by an angle of θ 1104. In accordance with some other embodiments of the invention, safety inertial sensor 1130 includes double tethers 1135 separated by angle θ=180 degrees. The safety inertial sensors include conductive pads 1101, proof mass 1102 attaching the double tethers 1103, electrical signal 1106, and circuits 1107. Directional agitation 1105 is applied to the cell including the safety inertial sensor 1108. Electrode tethers 1103 are fabricated with their free ends attached to proof mass 1102. The proof mass 1102 has at least one conductive layer that passes electrical signal 1106. In FIG. 11, the electrode tethers 1103 and proof mass 1102 in cell 1108 are completing an electronic circuit. At a specified external directional agitation 1105, the resulting stress on the neck of the electrode tethers causes them to break, creating an open circuit that prevents the electrical signal 1106 from reaching other circuits (not shown in FIG. 11).

Applications of the safety inertial sensor may be as a disposable packaged MEMS device to secure the safety of electrical circuits in harsh environments. The safety inertial sensor has various advantages over accelerometers and force sensors that can be used for the same purpose. These advantages include simple principle of operation that relies only on the mechanical signature, capability to cover wide range of harsh conditions, reduced design complexity, compact size, reliability, ease of packaging and low cost.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method for forming an electronic device, comprising:
designing a tether, wherein the tether includes a first end and a second end;
selecting an attachment point on the electronic device;
attaching the first end of the tether to the attachment point, wherein the electronic device is encapsulated in a cell;
selecting an anchor point;
attaching the second end of the tether to the anchor point;
determining fracture conditions at which the first end of the tether detaches from the attachment point;
agitating the cell at the fracture conditions so as to detach the first end of the tether from the attachment point; and
separating the electronic device from the cell.

2. The method of claim 1, wherein the electronic device is encapsulated in the cell of a wafer, die or other holder.

3. The method of claim 2, wherein the cell includes a cell frame.

4. The method of claim 3, wherein the anchor point is on the cell frame.

5. The method of claim 1, wherein the anchor point is a proof mass.

6. The method of claim 1, wherein the electronic device is a mesoscale, microscale or nanoscale device.

7. The method of claim 1, further comprising designing the electronic device, wherein the electronic device is one or more components.

8. The method of claim 7, wherein each component is attached to the cell by one or more tethers.

9. The method of claim 8, wherein the electronic device is a safety inertial sensor.

10. The method of claim 1, wherein the fracture conditions comprise agitation frequency, agitation amplitude, and directional agitation angle with respect to the tether.

11. The method of claim 1, wherein the tether is a linear breadth tapered cantilever beam, prismatic cantilever beam, tapered cantilever beam of truncated wedges, tapered cantilever beam of truncated cone, doubly-tapered cantilevered beam, or a group of cantilever beams truncated at different shape-functions.

12. A method, comprising:
designing a plurality of electronic devices, wherein each of the electronic devices is encapsulated in a cell of a wafer, die or other holder;
designing a plurality of tethers, wherein each tether includes a first end and a second end;
selecting an attachment point on each of the plurality of electronic devices, respectively;
attaching the first end of each of the plurality of tethers to a respective one of the attachment points;
selecting a plurality of anchor points;
attaching the second end of each of the plurality of tethers to a respective one of the anchor points;
determining, for each of the electronic devices, fracture conditions at which the first end of the respective tether detaches from the attachment point of the respective electronic device, wherein the fracture conditions are the same for a group of electronic devices among the plurality of electronic devices;
agitating the wafer, die or other holder at the fracture conditions for the group of electronic devices so as to selectively and in parallel detach the first ends of the respective tethers from the attachment points of the respective electronic devices of the group; and
separating the electronic devices of the group from the wafer, die or other holder.

13. The method of claim 12, wherein the cell includes a cell frame.

14. The method of claim 13, wherein one or more of the anchor points is on the cell frame.

15. The method of claim 12, wherein one or more of the anchor points is a proof mass.

16. The method of claim 12, wherein the electronic devices are mesoscale, microscale or nanoscale devices.

17. The method of claim 12, wherein one or more of the electronic devices includes one or more components.

18. The method of claim 17, wherein each component is attached to the cell by one or more tethers.

19. The method of claim 18, wherein one or more of the electronic devices is a safety inertial sensor.

20. The method of claim 12, wherein the fracture conditions comprise agitation frequency, agitation amplitude, and directional agitation angle with respect to the respective tether.

* * * * *